COVERLAY ENCAPSULATOR FOR PRINTED WIRING

Filed Oct. 24, 1965

INVENTOR.
NORMAN R. BUCK
BY Meyers & Peterson
ATTORNEYS 3,441,463
Patented Apr. 29, 1969

3,441,463

COVERLAY ENCAPSULATION FOR PRINTED WIRING

Norman R. Buck, Northfield, Minn., assignor to G. T. Schjeldahl Company, Northfield, Minn., a corporation of Minnesota Filed Oct. 24, 1965, Ser. No. 504,561
Int. Cl. B32b *31/10*
U.S. Cl. 156—549 5 Claims

ABSTRACT OF THE DISCLOSURE

A coverlay encapsulator for printed wiring utilizing a pair of cooperating coaxial rollers having a nip zone therebetween, one of the rollers being provided with an outer surface having a plurality of ribs protruding radially outwardly in spaced relationship from the normal roller surface, these ribs preferably being arranged in a substantially V form with the legs being arranged at an acute angle to the axis of the rollers with the apex being disposed substantially along the central transverse axis of the roller.

The present invention relates generally to an improved method and apparatus for preparing a laminate structure, and more specifically to an improved method and apparatus for preparing a laminate structure having a coverlay film disposed over and upon a conductor-substrate structure, the coverlay being in encapsulating relationship to the conductor and exposed portion of the substrate structure.

In the use of printed wiring generally, and specifically in the use of flexible printed wiring, it is frequently desirable to apply an encapsulating coverlay film on the surface thereof in order to provide mechanical and electrical stability to the system over an extended period of time. For example, certain specific uses and certain specific environments of use require that the conductors be encapsulated. While the mechanical application of a coverlay to conductors is felt to be generally uncomplicated, it has been found that in certain applications for the circuitry, particularly high frequency applications, extreme uniformity of conductor environment is required, this uniformity extending to the encapsulating materials and techniques. A flexible laminate structure is preferred for certain applications, the preference extending to both mechanical and electrical considerations. The versatility of such devices is well recognized in the art, with the flexible laminate providing versatility in connection arrangements and installation arrangements. Generally, however, for purposes of mechanical uniformity, application of a coverlay encapsulating film on a conductor-substrate surface is preferably accomplished with an adhesive bond, the adhesive being applied between the coverlay film and the exposed surfaces of the conductor and substrate. The adhesive is accordingly applied in sufficient quantities to permit a bond to be established to the surfaces of both the conductor and the substrate. Therefore, an adhesive in viscous liquid form is most conveniently utilized; however, this type of bonding medium creates substantial problems, especially in an encapsulating operation due to the constant agitation of the system contributing to the entrainment of air and other gases in the adhesive medium. Whether the material being encapsulated is applied in an operation involving individual sheets, or on a roll-to-roll basis, the bonding operation is conveniently conducted at the nip of a pair of mating rollers, either or both of which may be heated, and wherein there is a tendency for the viscous liquid to be forced away from the nip and thereby collect or become lodged as a viscous volume or mass in the area or zone directly ahead of the nip. Since this volume or mass of adhesive normally entrains substantial quantities of air and other gases, voids, discontinuities, or other anomalous areas will occur along the surfaces being joined. These voids are clearly undesirable from both mechanical and electrical considerations.

In accordance with the present invention, a pair of mating rollers are provided to apply the force necessary to establish a bond between the coverlay member and the surface of the conductor and substrate, the bond being provided with a viscous adhesive. One of these rolls is provided with radially protruding, laterally disposed ribs or the like which tend to form integral encapsulating zones between areas wherein the surfaces are being bonded or otherwise held in intimate contact, one with another. In other words, small isolated areas of entrained gases are deliberately encapsulated in the bonded zone between the surfaces being joined, and this random distribution of small or even microscopic bubbles has been found to be acceptable in the final product, both mechanically and electrically. No undesirable side effects are achieved in the use of this product so formed, even at high frequencies. These radially protruding or extending ribs in the sealing roll, upon contacting the quantity of adhesive disposed in the area adjacent the nip, will break up, destroy and discourage formation of large voids, and any voids which may exist are removed from the sealing system as they come into the area immediately adjacent and ahead of the nip.

Therefore, it is an object of the present invention to provide an improved apparatus and technique for applying a coverlay encapsulating film to the surface of a conductor-substrate structure.

It is a further object of the present invention to provide an improved technique for applying a coverlay encapsulating film to a printed wiring conductor and substrate.

It is still a further object of the present invention to provide an improved technique for encapsulating printed circuitry wherein uniform mechanical and electrical properties are obtained in the finished product.

Other and further objects of the present invention will become apparent by those skilled in the art upon a study of the following specification, appended claims and accompanying drawings, wherein:

Figures 1, 2:
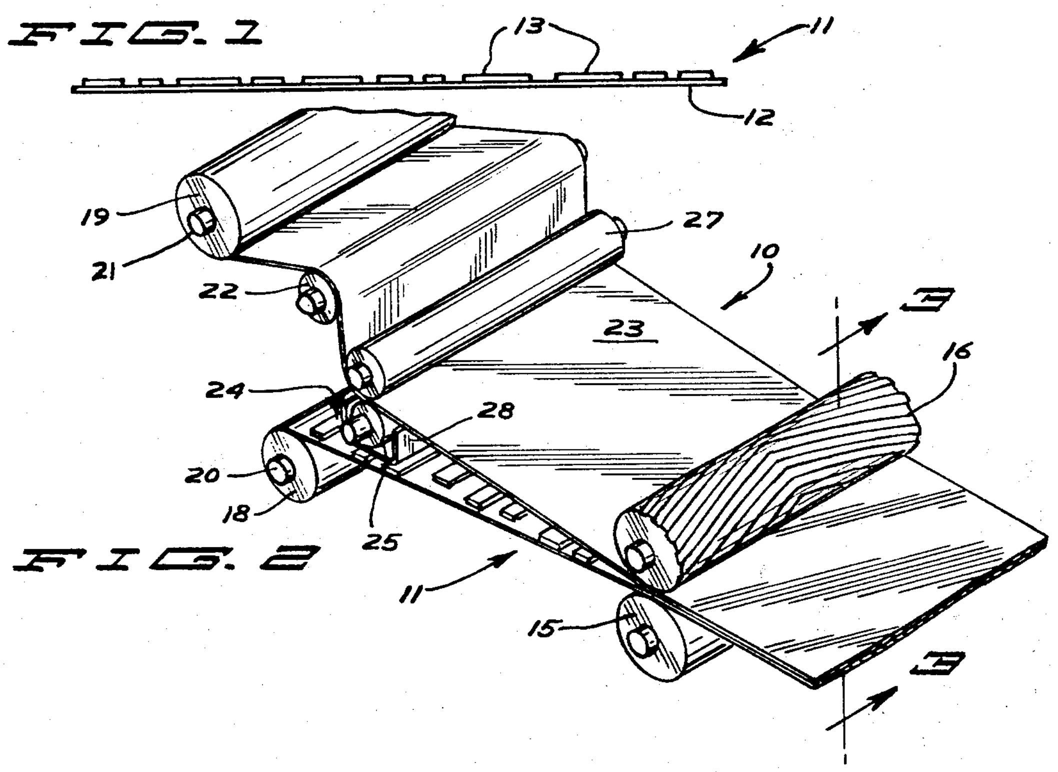
FIGURE 1 is an elevational view of a printed wiring assembly including a substrate and a conductor, as is conventionally utilized in the art.
FIGURE 2 is an isometric view of an apparatus specifically designed for applying a coverlay encapsulating film to a printed wiring structure, such as is illustrated in FIGURE 1.
Figure 3:
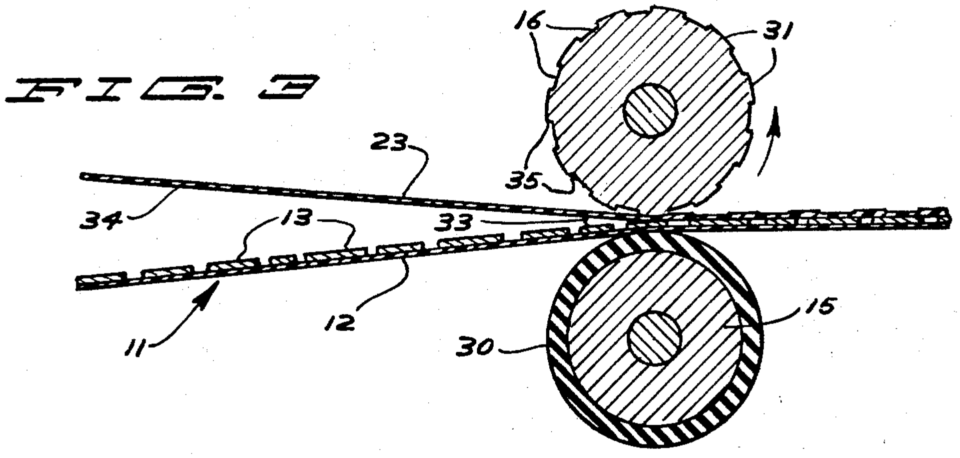
FIGURE 3 is a vertical sectional view taken along the line and in the direction of the arrows 3—3 of FIGURE 2.
Figure 4:
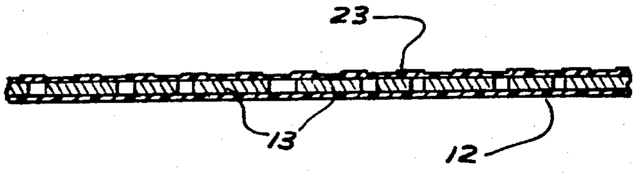
FIGURE 4 is a detail vertical sectional view of the product obtained from the apparatus and technique shown in FIGURE 2.

In accordance with the present invention, the encapsulating apparatus which is shown generally at 10 in FIGURE 2, is arranged to treat printed wiring such as illustrated at 11 in FIGURE 1, the printed wiring including a flexible substrate member 12 along with conductors 13—13 disposed in appropriate relative disposition along the surface thereof. The encapsulating apparatus 10 includes a pair of mating sealing or encapsulating rollers 15 and 16, these rollers being adapted to receive the sheet material which is wound from the supply rolls 18 and 19. Individual cores 20 and 21 are provided for the material rolls 18 and 19, respectively. Suitable take-up rolls, not shown, are also provided for the system, the system operating on a roll-to-roll basis. The encapsulating apparatus 10 further includes an adhesive applying assembly generally designated 24, this assembly including an applicator roll 25 which is disposed in kissing relationship to the under surface of the sheet material 23 which is obtained from the supply roll 19. As indicated in FIGURE 2, a pressure-exerting roll 27 may be disposed in overlying relationship to the adhesive roll 25 in order to assist in the formation of a uniform coat of viscous adhesive on the film surfaces. As is conventional, the reservoir 28 includes a supply of adhesive which will ultimately form a continuous film around the outer periphery of the roller 25.

Turning now to the description of the sealing rollers 15 and 16, it will be observed that the roller 15 has an outer peripheral covering of a compressible or resilient material such as rubber, cork or the like, such as is shown at 30. If rubber is utilized, a reasonably firm durometer has ben found satisfactory for most operations, particularly when the substrate and coverlay material are fabricated stress oriented polyethylene terephthalate, such as is commercially available under the trade name Mylar, with the metallic conductors being copper. The roll 16 is disposed in overlying relationship to the roll 15 with the nip between the rolls arranged to receive the individual sheets of the laminate. The outer periphery of the roller 16 is provided with a plurality of radially protruding axially aligned ribs 31—31. These ribs extend outwardly from the surface of the roll for a distance sufficient to entrap or encapsulate air or other gas which may be entrained in the adhesive which collects a head of the nip of the rolls, this adhesive collection being shown at 33 and being obtained from the adhesive film applied to the underside of the film 23 as shown at 34. Therefore, as the leading edge area 35 of each of the individual ribs 31 approaches the location of the adhesive material at 33, the interface formed by the leading edge 35 serves to entrap or otherwise encapsulate any air bubbles which may be present in the adhesive material collected at 33. The constant dispersal of entrained air or other gas provides random distribution of small quantities of this air, thereby eliminating anomalous electrical and mechanical effects from the finished product.

It will be appreciated that any suitable and compatible adhesive may be utilized in carrying out the various features of the present invention. When a substrate of one mil polyethylene terephthalate is covered with copper conductors of one ounce copper and this system is covered with an encapsulating film of one mil stress oriented polyethylene terephthalate, an adhesive consisting essentially of polyethylene terephthalate dispersed in a suitable solvent and having a viscosity sufficiently high to apply a cured film of adhesive of about one-half mil thickness has been found to be satisfactory for ordinary operation.

It will be appreciated that various mechanisms are provided for permitting axial rotation of the individual roller elements 20 and 21, along with the shaft which extends through the axis of the rollers 15 and 16 and the adhesive station rollers 25 and 27. No special design is required for this system, it being appreciated that the system utilized must be one which may suitably provide a coverlay encapsulating film over the surface of the conductor-substrate laminate preferably on a roll-to-roll basis.

It is observed that the ribs 31—31 are disposed at an acute angle to the transverse axis of the roller 16. The pattern is one which both assists in encapsulating the entrained gases in the adhesive material and which also tends to drive certain of these enchained gases axially outwardly in order that they may be thereby eliminated from the system entirely without ultimately being carried into the product. An angle of about 15° from the axis has been found to provide good results. Of course, the radial protrusions may be parallel to the axis of the roll, if desired.

It will be appreciated that the specific examples given herein are for purposes of illustration only and that accordingly those skilled in the art may depart from these examples without actually departing from the spirit and scope of the present invention.

I claim:

1. An apparatus for encapsulating printed wiring laminate wit hat least one flexible coverlay film on a roll-to-roll basis, said apparatus having:

(a) means for retaining a supply of printed wiring laminate and a supply of coverlay film;

(b) means for applying adhesive to at least one surface of said coverlay film, and (c) a pair of cooperatively arranged peripherally contacting first and second rollers with means for applying pressure to the nip area formed between said rollers, said rollers being characterized in that the outer surface of said first roller has a plurality of substantially continuous, generally transversely extending ribs protruding radially outwardly in spaced relationship from the surface thereof, and the mating outer surface of said second roller is substantially resilient in nature.

2. The apparatus as defined in claim 1 being particularly characterized in that said ribs are arranged at a substantially acute angle to the axis of the rollers.

3. The apparatus as defined in claim 1 being particularly characterized in that said ribs have a substantially V form with the legs thereof being arranged at an acute angle to the axis of the rollers and with the apex being disposed substantially along the central transverse axis of the roller.

4. The apparatus as defined in claim 1 being particularly characterized in that drive means are provided for rotating said rollers.

5. The apparatus as defined in claim 3 being particularly characterized in that means are provided for rotating said rollers in a predetermined radial direction about the axis thereof with the apex area formed by said legs arriving at said nip area prior to the arrival of said legs.

References Cited

UNITED STATES PATENTS

| | | | |
|---|---|---|---|
| 146,240 | 1/1874 | Field | 156—549 |
| 1,831,403 | 11/1931 | Woodward | 156—549 XR |
| 2,737,764 | 3/1956 | Lewis | 156—582 XR |
| 3,056,164 | 10/1962 | Reichel et al. | 226—193 |

EARL M. BERGERT, *Primary Examiner.*

M. L. KATZ, *Assistant Examiner.*

U.S. Cl. X.R.

29—121; 156—301, 324; 226—193